United States Patent
Dutartre et al.

(10) Patent No.: US 8,975,730 B2
(45) Date of Patent: Mar. 10, 2015

(54) METHOD FOR PROTECTION OF A LAYER OF A VERTICAL STACK AND CORRESPONDING DEVICE

(71) Applicants: STMicroelectronics (Crolles 2) SAS, Crolles (FR); STMicroelectronics SA, Montrouge (FR)

(72) Inventors: Didier Dutartre, Meylan (FR); Michel Marty, Saint Paul de Varces (FR); Sebastien Jouan, Crolles (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 55 days.

(21) Appl. No.: 13/622,573

(22) Filed: Sep. 19, 2012

(65) Prior Publication Data

US 2013/0075870 A1 Mar. 28, 2013

(30) Foreign Application Priority Data

Sep. 20, 2011 (FR) ...................................... 11 58341

(51) Int. Cl.
*H01L 29/06* (2006.01)
*H01L 21/768* (2006.01)
*H01L 21/762* (2006.01)

(52) U.S. Cl.
CPC .... *H01L 21/76898* (2013.01); *H01L 21/76251* (2013.01)

USPC ............ 257/622; 257/316; 257/352; 257/637

(58) Field of Classification Search
CPC .................. H01L 21/76251; H01L 21/76898; H01L 2221/1078
USPC ................. 438/622, 424, 426, 427, 637, 700; 257/622, 637, 316, 532
See application file for complete search history.

(56) References Cited

U.S. PATENT DOCUMENTS

| | | | | |
|---|---|---|---|---|
| 5,494,849 | A | * | 2/1996 | Iyer et al. ...................... 438/459 |
| 5,668,045 | A | * | 9/1997 | Golland et al. ............... 438/459 |
| 6,544,848 | B1 | | 4/2003 | Ang et al. |
| 2003/0092244 | A1 | * | 5/2003 | Oi et al. ......................... 438/455 |
| 2004/0092075 | A1 | | 5/2004 | Yeo et al. |
| 2009/0050867 | A1 | | 2/2009 | Wells et al. |
| 2010/0006840 | A1 | * | 1/2010 | Robert ............................. 257/49 |
| 2012/0273865 | A1 | * | 11/2012 | Lee et al. ....................... 257/316 |
| 2013/0154055 | A1 | * | 6/2013 | Park et al. ..................... 257/532 |

FOREIGN PATENT DOCUMENTS

FR 2860842 4/2005

* cited by examiner

*Primary Examiner* — Long K Tran
(74) *Attorney, Agent, or Firm* — Allen, Dyer, Doppelt, Milbrath & Gilchrist, P.A.

(57) ABSTRACT

A device and corresponding fabrication method includes a vertical stack having an intermediate layer between a lower region and an upper region. The intermediate layer is extended by a protection layer. The vertical stack has a free lateral face on which the lower region, the upper region and the protection layer are exposed.

10 Claims, 4 Drawing Sheets

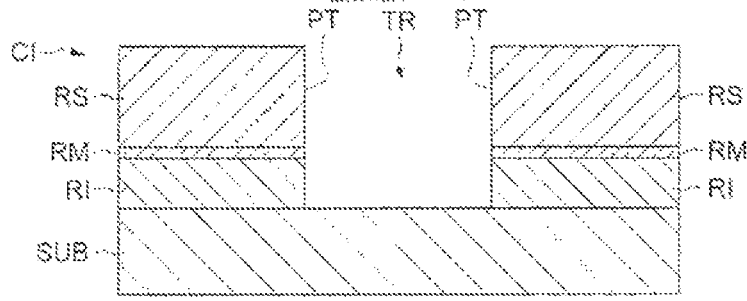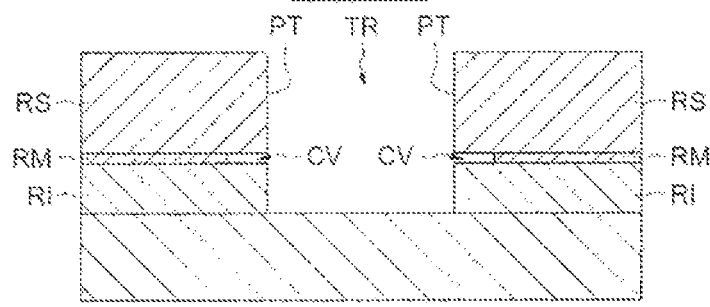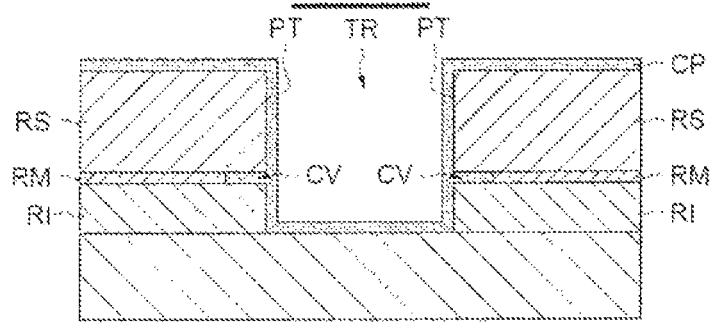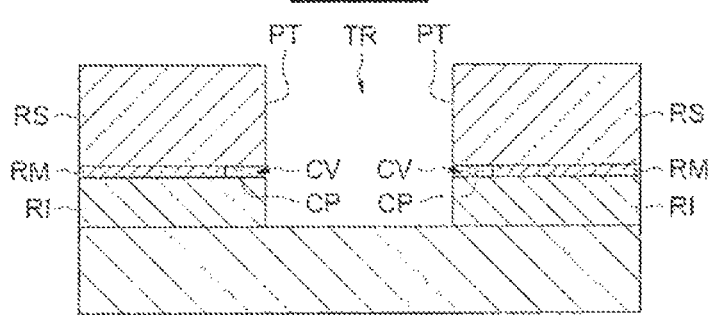

METHOD FOR PROTECTION OF A LAYER OF A VERTICAL STACK AND CORRESPONDING DEVICE

FIELD OF THE INVENTION

The invention relates to microelectronics, and, more particularly, to the protection of layers opening onto lateral faces within semiconductor substrates.

BACKGROUND OF THE INVENTION

The wafers used in microelectronics generally comprise bevelled (or chamfered) edges on their periphery. When two wafers of this type are assembled, for example, in order to form three-dimensional integrated circuits or imaging devices with backside illumination, the bevelled peripheral parts are not maintained. A thinning of one of the two wafers after the assembly can cause a fracture of the bevelled peripheral parts not maintained. One proposed approach is to mechanically cut away (or trim) the bevelled peripheral part of at least one of the two wafers prior to the thinning step. For this purpose, reference may be made to French Patent application FR2860842, which describes a wafer trimming method.

Conventionally, to increase the number of integrated circuits formed on the same wafer, integrated circuits are fabricated up to the periphery of the wafers. Generally, this may be up to 3 millimeters from the edge of the wafer. The implementation of a step for cutting away the bevelled peripheral parts can expose one or more metallization levels of the integrated circuits on a wafer. These metallization levels generally comprise copper, and conventionally, exposed copper can contaminate the equipment in which fabrication steps will be implemented or the semiconductor substrate itself.

One proposed approach is therefore to protect the walls obtained after a step for removal of the bevelled peripheral parts. This may involve depositing a conformal layer of insulating material on the unassembled surface, and on the walls obtained. This approach has a drawback that layers of material that do not require protection are coated, and mechanical stresses can cause defects.

Another approach is to form lateral protections according to a method well known to those skilled in the art that allows spacers to be obtained, usually disposed around the gates of the transistors. These protections are only situated on the cutaway peripheral parts of the wafers. One drawback of this approach is that it is only applicable on edges that are cut away substantially vertically. In other words, if the edges are not cut perpendicular to the plane of the wafer, then the cut-away edges are generally sloping.

SUMMARY OF THE INVENTION

According to one embodiment and its implementation, an improvement in the protection of a layer of a vertical stack is provided.

According to one aspect, a method is provided comprising removal of a part of a vertical stack comprising an intermediate layer disposed between a lower region and an upper region so as to open up for the stack at least one free lateral face on which the lower region, the upper region, and the intermediate layer are exposed. The method may further comprise the formation of a cavity in the intermediate layer running from the free face, the conformal and continuous deposition of a protection material on the free face and in the cavity, and the removal of the portion of protection material situated on the free face.

A protection of the intermediate layer may thus be obtained by the protection material disposed only in the neighborhood of the free face and on the intermediate layer. In other words, the protection material may replace the intermediate layer at least in the neighborhood of the free face. Furthermore, the removal of the portion of protection material situated on the free face may allow the defects that may appear when the protection material is in contact with other layers not requiring any protection to be limited.

Those skilled in the art will know how to choose the protection material according to the desired properties for electrical and mechanical protection. By way of example, a dielectric material may be chosen.

A thickness of protection material greater than or equal to half the thickness of the intermediate layer may be deposited. Indeed, a conformal and continuous deposition of a thickness greater than or equal to half the thickness of the intermediate layer may allow the cavity formed in the intermediate layer to be completely filled. The encapsulation of air may thus be prevented, and the layer may be better protected when the protection material is removed on the free face.

Advantageously, the formation of the cavity in the intermediate layer may comprise a selective chemical etch. Thus, the etching of the intermediate layer may not require any etch mask formed by a photolithographic step. A selective etch step will remove a certain quantity of material of the intermediate layer from the free face without etching the layers comprising different materials.

The vertical stack may comprise, between the lower region and the upper region, a plurality of intermediate layers respectively separated by separating regions. The method may comprise the removal of a part of the vertical stack to open up for the stack at least one free face on which the intermediate layers and the separating regions are exposed. The method may further comprise the formation of a cavity in each intermediate layer running from the free face, a conformal and continuous deposition of a protection material onto the free face and into each cavity, and the removal of the portion of protection material situated on the free face.

Several intermediate layers, comprising the same material or different materials, may thus be protected. If the intermediate layers comprise the same material then a single selective etch step may be implemented to form all the cavities. Furthermore, the deposition of the protection material may be implemented by a single deposition step.

The vertical stack may be formed by depositing a plurality of layers onto a substrate used in microelectronics. The intermediate layer or layers may notably be metallization levels comprising copper. The upper, lower, and separating regions may be insulating layers separating the various metallization levels.

The vertical stack may be formed by assembling two wafers. A part of the vertical stack may be removed, where the vertical stack may comprise the removal of the bevelled edges of at least one of the two wafers and the free face being situated on the periphery of the at least one of the two wafers.

Thus, the vertical stack may be formed during a step for cutting away or for trimming the bevelled edges of a wafer. The copper of the metallization levels exposed may be protected by the protection material, for example, a dielectric material.

As a variation, the removal of a part of the vertical stack may comprise the formation of at least one trench within an integrated circuit fabricated on the substrate. The removal may form at least two free faces. The intermediate layers may also comprise copper and be protected by a protection material comprising a dielectric material.

According to another aspect, a device may be provided comprising a vertical stack comprising an intermediate layer disposed between a lower region and an upper region. The intermediate layer may be extended, directly or via a gap, by a protection layer. The vertical stack may have a free lateral face on which the lower region, the upper region and the protection layer are exposed.

The vertical stack may comprise, between the lower region and the upper region, a plurality of intermediate layers disposed between separating regions, with each intermediate layer being extended, directly or via a gap, by a protection layer. The vertical stack may have a free lateral face on which the protection layers and the separating regions are exposed.

The vertical stack may comprise a plurality of layers on a substrate used in microelectronics. The vertical stack may comprise an assembly of two wafers, with the free face being situated on the periphery of at least one of the two wafers. The free face may be situated within a trench of an integrated circuit. The intermediate layer may comprise copper and the protection material may comprise a dielectric material.

BRIEF DESCRIPTION OF THE DRAWINGS

Other advantages and features of the invention will become apparent upon studying the detailed description of embodiments and their implementation, taken by way of non-limiting examples and illustrated by the appended drawings in which:

FIGS. 6 to 9 illustrate another embodiment and its implementation according to the invention in which the layer to be protected is situated within a trench of an integrated circuit.

DETAILED DESCRIPTION OF THE PREFERRED EMBODIMENT

Figure 1:
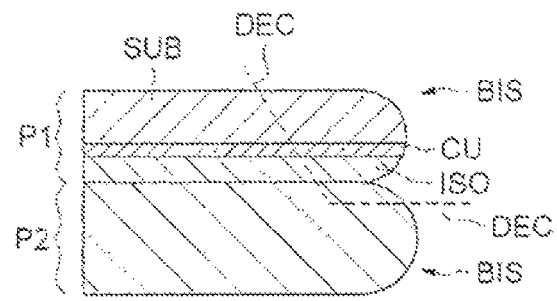
FIGS. 1 to 5 illustrate one embodiment and its implementation according to the invention in which the layer to be protected is situated on the periphery of a trimmed wafer.

In FIG. 1, an assembly of two wafers P1 and P2 is shown. For example, the two wafers may be used in microelectronics. The wafer P1 can be a wafer comprising silicon with a plurality of layers. The layers may notably include a silicon substrate SUB, a layer of a metallization level CU, and an insulating region ISO. The wafer P1 also comprises a bevelled peripheral edge BIS. The wafer P2 can be a wafer comprising silicon or equally a glass wafer with a bevelled peripheral edge BIS. The bevelled peripheral edges of each wafer are not mutually bonded after the assembly of the wafers P1 and P2.

To form conducting silicon vias (i.e., TSVs: Through Silicon Vias) or to form rear-face illuminated imaging devices, the wafer P1 can be thinned. It may therefore be necessary to cut off, or to trim the bevelled peripheral edges BIS of the wafer P1.

It could, for example, be cut away using a plurality of mechanical and chemical etch steps depending on the cutting profile DEC. The profile DEC conventionally defines a cut forming a slope in the wafer P1, and a part of the wafer P2 is removed.

Figure 2:
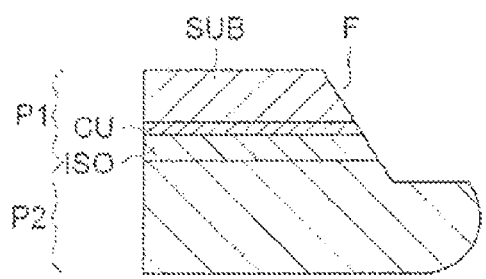

In FIG. 2, the wafers P1 and P2 are shown after the cutting away of the bevelled edge BIS of the wafer P1. Conventionally, a free face F is obtained partially that is sloping and partially horizontal.

The layer of a metallization level CU is exposed on the face F, and copper is thus exposed on a lateral face. It is this layer of a metallization level CU which forms an intermediate layer to be protected.

Figure 3:
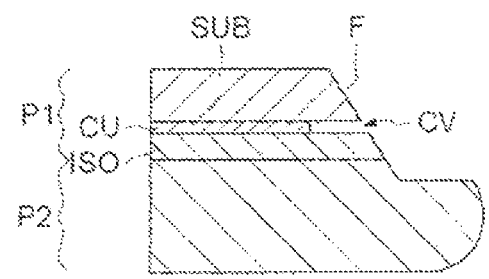

In FIG. 3, the two wafers P1 and P2 are shown after a step for formation of a cavity in the layer of a metallization level CU. The cavity CV can be formed by way of a selective etch, for example, a chemical etch designed to only etch the copper and to have no effect on the substrate SUB or the insulating region ISO. For a layer of a metallization level CU having a thickness on the order of a micrometer (for example, the highest metallization level of an integrated circuit), a cavity having a depth greater than a micrometer, for example 2 or 3 micrometers, could be formed.

Figure 4:
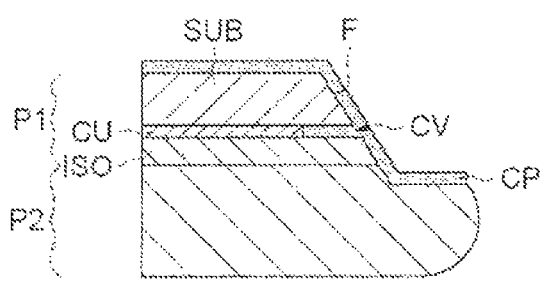

A conformal and continuous deposition of a layer of a protection material on the free face F and in the cavity (FIG. 4) can subsequently be implemented. This deposition step forms a layer of a protection material CP on the face F, in the cavity CV, and also on the unassembled face of the wafer P1. The protection material can be a dielectric material, for example, silicon dioxide ($SiO_2$) or silicon carbonitride (SiCN), and it can be deposited by a CVD (Chemical Vapourphase Deposition) method resulting in a conformal deposition. In other words, the dielectric material is substantially equal thickness based on the local orientation of the surface onto which the deposition takes place.

The thickness of the deposition is defined as a function of the height of the cavity CV, itself defined by the thickness of the layer of a metallization level CU. Advantageously, a layer of a protection material CP is deposited with a thickness greater than or equal to half the thickness of the intermediate layer. By way of example, for a thickness of the layer of a metallization level CU of one micrometer, a layer of a protection material CP is deposited with a thickness greater than 0.5 micrometers to completely fill the cavity CV by a conformal and continuous deposition.

Figure 5:
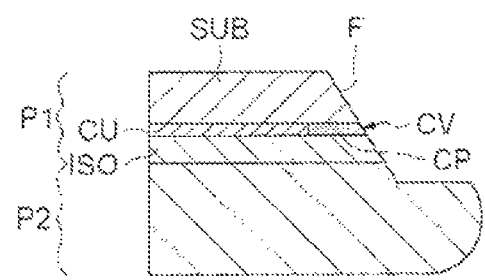

The removal of the layer of protection material CP (FIG. 5) can then be implemented. This layer can be removed from the free face F and, where required, from the unassembled face of the wafer P2. The cavity CV is filled with protection material CP, and there is no longer any protection material on the free face F. The removal of the layer of protection material can be implemented by way of an etch step, for example, adapted to etch away a thickness of material corresponding to the thickness of the layer CP. Thus, all the protection material CP on the free face F and on the unassembled face of the wafer P1 is removed, but to a negligible extent within the cavity CV, which has a lateral extension with dimensions much greater than half of its height.

The layer of a metallization level CU is thus protected on the periphery of the wafer P1, and the material used allows any contamination by copper of the equipment in which fabrication steps will be implemented, or of the semiconductor substrate of the wafers P1 and P2, to be reduced or prevented.

A vertical stack is obtained comprising an intermediate layer (the layer of a metallization level CU) disposed between a lower region (the wafer P2 and the insulating layer ISO) and an upper region (the substrate SUB). The intermediate layer may be extended by a protection layer CP. The vertical stack has a free lateral face F on which the lower region, the upper region and the protection layer are exposed.

In FIG. 6, a variation is shown in which a trench TR has been formed within an integrated circuit CI. This integrated circuit CI comprises a plurality of layers forming a vertical stack. This vertical stack comprises a substrate SUB, for example, a silicon substrate, a lower region RI disposed on top of the substrate SUB, an intermediate layer RM and an upper region RS. The intermediate layer can be a layer of copper or a layer of another material used in microelectronics and also in MEMS (micro-electromechanical systems). The trench TR comprises two walls PT and the upper region RS, the intermediate layer RM and the lower region are exposed on each wall.

To protect the intermediate layer RM, cavities CV in the intermediate layer RM can be formed from each wall PT of the trench TR, as illustrated in FIG. 7. A layer of a protection material CP can then be deposited on the walls PT of the trench TR, on the bottom of the trench TR, on top of the upper region RS and in the cavities CV.

Lastly, as illustrated in FIG. 8, the removal of the layer of a protection material CP on the walls PT of the trench TR, on the bottom of the trench TR, and on top of the upper region RS can be implemented while conserving the layer of protection material CP within the cavities CV. Thus, a protection of the intermediate layer RM exposed on a vertical wall is obtained.

Figure 10A:
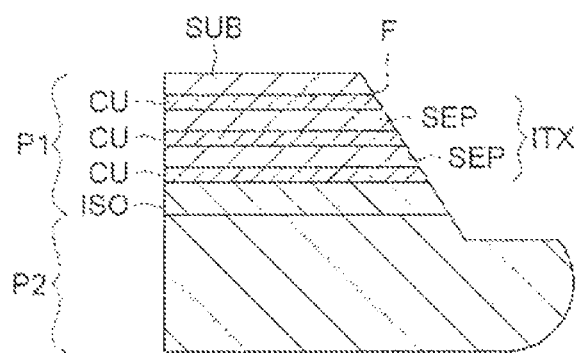
FIGS. 10*a*, 10*b*, 11*a* and 11*b* illustrate various embodiments and their implementation according to the invention in which several layers are to be protected.

One variation will now be described with reference to FIGS. 10a and 10b. In FIG. 10a, an assembly of two wafers P1 and P2 is shown schematically after a cutting or trimming step so as to form a free face F. The wafer P1 comprises three layers of metallization levels CU situated within an interconnection network ITX (known to those skilled in the art by the acronym BEOL: Back End Of Line). The layers of metallization levels CU are separated by separating regions SEP, and the wafer P1 also comprises an insulating region ISO in contact with the wafer P2 and a substrate SUB.

Figure 10B:
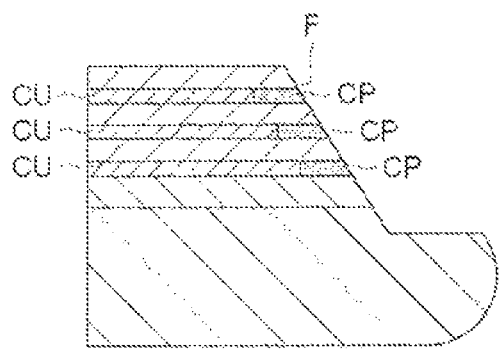

As illustrated in FIG. 10b, the three layers of metallization levels CU can be simultaneously protected by common steps, notably the formation of cavities in each layer of metallization levels (formed by a single selective etch step), the deposition on the free face F and, within each cavity, a layer of a protection material, and the removal from the free face of the layer of protection material. The device illustrated in FIG. 10b is thus obtained in which several layers of metallization levels CU are extended by a protection layer exposed on the free lateral face F.

Figure 11A:
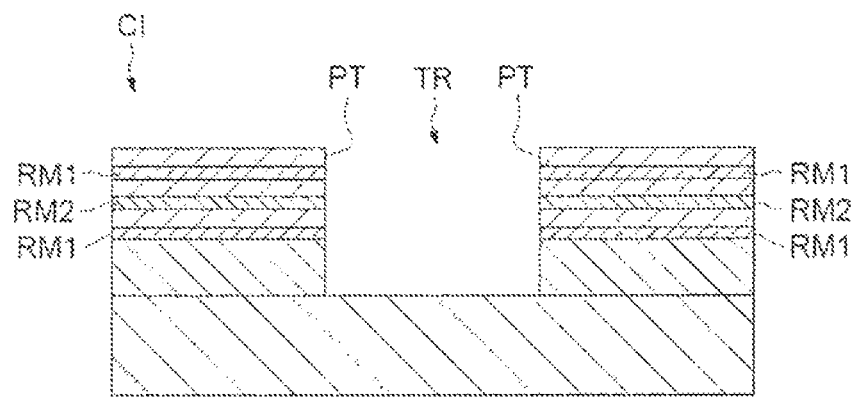
Figure 11B:
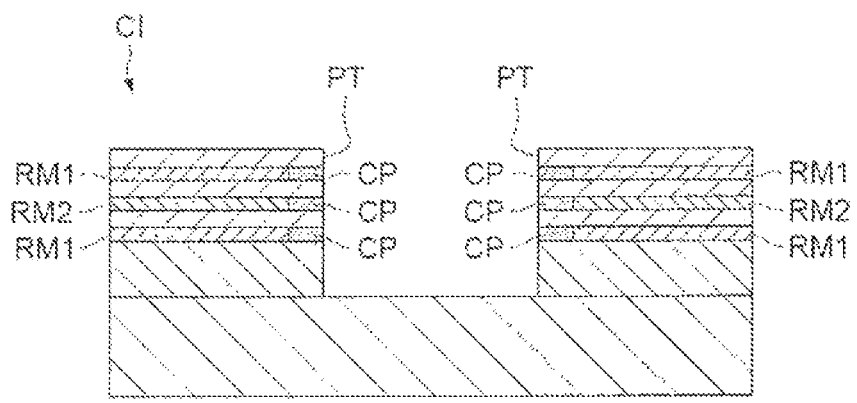

Finally, FIGS. 11a and 11b illustrate another variation. FIG. 11a shows an integrated circuit CI comprising a trench TR, two intermediate layers RM1 and an intermediate layer RM2 disposed between the two intermediate layers RM1 and separated by separating regions SEP. The intermediate layers RM1 and RM2 comprise various materials.

Thus, when the cavity is formed in these layers, a first selective etch step allowing only the material of the layers RM1 to be etched and a second selective etch step allowing only the material of the layers RM2 to be etched can be implemented. However, a single step for deposition of a layer of a protection material and a single step for removal of this layer from the walls PT are needed to obtain the device illustrated in FIG. 11b. In FIG. 11b, an integrated circuit CI is shown in which several intermediate layers RM1 and RM2 are protected and comprise different materials.

Accordingly, a method for protection of at least one layer of a vertical stack is obtained, in which the other layers of the stack are not covered by a protection material, and which does not require photolithographic steps.

Furthermore, the implementation of such a method without photolithographic steps, which may be denoted by those skilled in the art by the expression "auto-aligned method," reduces the possibility of the occurrence of errors in alignment and renders the method more robust.

That which is claimed:

1. A device comprising:
   a vertical stack comprising a first silicon substrate, a second silicon substrate, and at least one intermediate layer between said first silicon substrate and second silicon substrate;
   said vertical stack comprising at least one free lateral face on which said first and second silicon substrates are exposed; and
   said vertical stack comprising a protection material in a cavity adjacent said at least one intermediate layer, with said protection material extending to the at least one free lateral face for exposure, and at least one of said first and second silicon substrates having a beveled edge, and with the at least one free lateral face being on a periphery of at least one of said first and second silicon substrates.

2. The device according to claim 1, wherein said at least one intermediate layer comprises a plurality of intermediate layers between said first and second silicon substrates, said vertical stack further comprising at least one separating region separating said plurality of intermediate layers, with said at least one separating region extended to the at least one free lateral face, and with there being protection material in a respective cavity adjacent each intermediate layer so that each intermediate layer is also extended to the at least one free lateral face.

3. The device according to claim 1, further comprising a substrate, and wherein said vertical stack is on said substrate.

4. The device according to claim 3, wherein an integrated circuit is fabricated on said substrate, and wherein said vertical stack further includes at least one trench within said integrated circuit so that the at least one free lateral face comprises two free lateral faces.

5. The device according claim 1, wherein said at least one intermediate layer comprises copper and said protection material comprises a dielectric material.

6. The device according to claim 1, wherein said at least one intermediate layer has a thickness, and said protection material has a thickness that is greater than or equal to one-half the thickness of said at least one intermediate layer.

7. A device comprising: a vertical stack comprising
   a first silicon substrate,
   a second silicon substrate,
   a plurality of intermediate layers between said first and second silicon substrates,
   at least one separating region separating said plurality of intermediate layers,
   said first and second silicon substrates and said at least one separating region extending to at least one free lateral face for exposure, and
   protection material adjacent each intermediate layer and in a cavity so that each protection material is also extended to the at least one free lateral face for exposure, and at least one of said first and second silicon substrates having a beveled edge, and with the at least one free lateral face being on a periphery of at least one of said first and second silicon substrates.

8. The device according to claim 7, further comprising a substrate, and wherein said vertical stack is on said substrate.

9. The device according to claim 8, wherein an integrated circuit is fabricated on said substrate, and wherein said vertical stack further includes at least one trench within said integrated circuit so that the at least one free lateral face comprises two free lateral faces.

10. The device according claim 7, wherein each intermediate layer comprises copper and said protection material comprises a dielectric material.

* * * * *